(12) United States Patent
Janesick et al.

(10) Patent No.: US 7,166,878 B2
(45) Date of Patent: Jan. 23, 2007

(54) IMAGE SENSOR WITH DEEP WELL REGION AND METHOD OF FABRICATING THE IMAGE SENSOR

(75) Inventors: James Robert Janesick, Huntington Beach, CA (US); Eugene L. Dines, Aliso Viejo, CA (US); Mark S. Muzilla, Riverside, CA (US); Maryn G. Stapelbroek, Santa Ana, CA (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/975,299

(22) Filed: Oct. 28, 2004

(65) Prior Publication Data

US 2005/0139833 A1 Jun. 30, 2005

Related U.S. Application Data

(60) Provisional application No. 60/517,281, filed on Nov. 4, 2003.

(51) Int. Cl.
*H01L 31/062* (2006.01)
(52) U.S. Cl. .................. 257/290; 257/291; 257/293; 257/444; 257/461; 257/462
(58) Field of Classification Search .................. None
See application file for complete search history.

(56) References Cited

U.S. PATENT DOCUMENTS

| 5,005,063 | A | 4/1991 | Janesick |
| 6,594,132 | B1 | 7/2003 | Avery |
| 6,787,383 | B1* | 9/2004 | Ikeda et al. ............... 438/44 |
| 6,821,809 | B1* | 11/2004 | Abe et al. .................. 438/65 |
| 2003/0214595 | A1* | 11/2003 | Mabuchi .................. 348/294 |
| 2004/0053436 | A1 | 3/2004 | Rhodes |

\* cited by examiner

*Primary Examiner*—Wai-Sing Louie
(74) *Attorney, Agent, or Firm*—Lowenstein Sandler PC

(57) ABSTRACT

An imager, an image sensor included in the imager and a method of fabricating the image sensor are provided. The image sensor having a substrate with front and back sides to produce image data, includes a transparent conductive coating arranged on the back side of the substrate, a first well region of a first conductive type having first and second opposite sides, the first side being arranged adjacent with the front side of the image sensor; and a second well region of a second conductive type, different from the first conductive type and having a deep well region provided adjacent with the second side of the first well region, the transparent conductive coating configured to develop or to receive a first potential and the first well region configured to receive a second potential to substantially deplete a region between the transparent conductive coating and the first well region.

20 Claims, 8 Drawing Sheets

IMAGE SENSOR WITH DEEP WELL REGION AND METHOD OF FABRICATING THE IMAGE SENSOR

CROSS-REFERENCE TO RELATED APPLICATION

This application claims the benefit of priority from U.S. Provisional Application No. 60/517,281, filed Nov. 4, 2003 the contents of which are herein incorporated by reference.

GOVERNMENT CONTRACT

This invention was made with U.S. Government support under a proprietary contract number. The U.S. Government has certain rights in this invention.

FIELD OF THE INVENTION

The invention relates to semiconductor imagers and, more particularly, to a back-illuminated image sensor that employs deep well technology.

BACKGROUND OF THE INVENTION

For over 20 years, charge-coupled devices (CCDs) have dominated digital imaging applications and markets. State of the art CCDs exhibit very few performance deficiencies. A combination of near-ideal performance and implementation has made the CCD a highly successful imaging sensor. There are, however, specific fundamental weaknesses associated with this technology. First, it is difficult to design CCD imagers (also sometimes referred to as an array of image sensors) that operate well in high-energy radiation environments. Second, CCD imagers typically require significant external support electronics for operation. Third, high-speed readout of signal charges of the CCD imagers is difficult because signal charges, for the most part, must be readout in a serial fashion as opposed to parallel or random access pixel acquisition.

Because of the deficiencies in CCD imagers, complementary metal oxide semiconductor (CMOS) imagers (i.e., arrays of image sensors with accompanying interface electronics) are displacing CCD imagers in some imaging applications, and this trend is expected to continue. The CCD imager deficiencies listed above are main strengths for CMOS imagers. CMOS technology including CMOS imagers is considerably more tolerant to high-energy radiation environments. CMOS technology, inherently, allows on-chip system integration designs that reduce size, power, weight and cost of devices, for example, of cameras while increasing reliability and lifetime of the devices. Lastly, CMOS arrays can be designed to be read in a parallel, random access fashion while allowing high-speed operation and low noise performance of the CMOS arrays. Current CMOS technology, however, is lacking in nearly every performance category compared to CCD technology.

What is needed is a CMOS image sensor with improved performance.

SUMMARY OF THE INVENTION

The present invention is embodied in a CMOS image sensor in which a deep well region of a first conductive type is formed in a substrate to isolate a well region of a second conductive type formed in the substrate.

The present invention may include alternate embodiments of the CMOS image sensor in which the substrate includes an epitaxial layer formed of a high resistivity second conductive type material such that a low dopant concentration level may be used in the well region of the second conductive type formed in the epitaxial layer.

The present invention is further embodied in a method of fabricating a CMOS image sensor in which a deep well region of the first conductive type is formed in a substrate to isolate the well region of the second conductive type from the substrate.

The present invention may include alternative embodiments of the method of fabricating the CMOS image sensor in which the substrate includes an epitaxial layer formed of a higher resistivity second conductive type material such that a lower dopant concentration level may be used in the well region of the second conductive type formed in the epitaxial layer.

To achieve the above and/or other aspects of the present invention, an image sensor to produce image data is provided that has a substrate with front and back sides, and includes a transparent conductive coating arranged on the back side of the substrate, a first well region of a first conductive type having first and second opposite sides, the first side being arranged adjacent with the front side of the image sensor; and a second well region of a second conductive type, different from the first conductive type, and having at least a deep well region provided adjacent with the second side of the first well region. The transparent conductive coating is configured to develop or to receive a first potential and the first well region is configured to receive a second potential to substantially deplete a region between the transparent conductive coating and the first well region.

To achieve the above and/or other aspects of the present invention, an image sensor to produce image data is provided that has a substrate with front and back sides, and includes a transparent conductive coating arranged on the back side of the substrate, a first well region of a first conductive type, a second well region of a second conductive type, different from the first conductive type, and circumferentially surrounding the first well region of the first conductive type, and a third well region of the second conductive type disposed between both of the first well region of the first conductive type and of the second well region of the second conductive type and the transparent conductive coating arranged on the back side of the substrate.

To achieve the above and/or other aspects of the present invention, an image sensor to produce image data is provided that has a substrate with front and back sides, and includes a transparent conductive coating arranged on the back side of the substrate, a first well region of a first conductive type arranged adjacent with the front side of the image sensor, and a second well region of a second conductive type, different from the first conductive type and having at least a deep well region, the first well region being isolated from the transparent conductive coating by the second well region.

To achieve the above and/or other aspects of the present invention, an imager to produce an image is provided that has a substrate with front and back sides, and includes a plurality of image sensors arranged on the substrate in an array. Each of the image sensors includes a first well region of a first conductive type having first and second opposite sides, the first side being arranged adjacent with the front side of the imager, and a second well region of a second conductive type, different from the first conductive type, and having at least a deep well region provided adjacent with the second side of the first well region. A common transparent conductive coating is arranged on the back side of the substrate and is common to all of the image sensors. The common transparent conductive coating is configured to develop or to receive a first potential and the first well region is configured to receive a second potential to substantially deplete a region of each of the image sensors between the transparent conductive coating and the first well region.

To achieve the above and/or other aspects of the present invention, an imager to produce an image is provided that has a substrate with front and back sides, and includes plurality of image sensors arranged on the substrate in an array. A common transparent conductive coating is arranged on the back side of the substrate and is common to all of the image sensors. Each of the image sensors includes a first well region of a first conductive type, a second well region of a second conductive type, different from the first conductive type, and circumferentially surrounding the first well region of the first conductive type, and a third well region of the second conductive type disposed between both of the first well region of the first conductive type and of the second well region of the second conductive type and the common transparent conductive coating arranged on the back side of the substrate. In each of the image sensors, the peak doping concentrations in the second and third well regions of the second conductive type may be substantially equal.

To achieve the above and/or other aspects of the present invention, a method of fabricating an image sensor to produce image data is provided that is formed in an epitaxial substrate layer grown on a base. The method includes forming an first well region of a first conductive type having at least a deep well region in the epitaxial layer, forming a second well region of a second conductive type, different from the first conductive type, in the epitaxial layer such that the first well region isolates the second well region from the epitaxial layer, removing the base, depositing a transparent conductive coating on the back side of the substrate, and configuring the transparent conductive coating to develop or to receive a first potential and the second well region to receive a second potential, whereby the region between at least the second well region and the transparent conductive coating is substantially depleted.

The method may include the epitaxial layer grown on the substrate or, otherwise, the epitaxial layer may be the substrate. If the epitaxial layer is grown on the substrate, then all or a portion of the substrate may be removed prior to the depositing of the transparent conductive coating. Accordingly, the terms "epitaxial layer" and "substrate" are used interchangeably.

The forming of the first well region may, preferably, include forming a first region of the first conductive type in the epitaxial layer by a first energy implant of the first conductive type and diffusing implant ions from the first energy implant in the first region, and forming a second region of the first conductive type in the epitaxial layer by a second energy implant of the first conductive type. The second energy implant of the first conductive type may be lower in energy than that of the first energy implant of the first conductive type.

The method may include annealing the epitaxial layer after the forming of the second well region of the second conductive type, forming a transistor gate dielectric layer on the epitaxial layer and forming metal oxide semiconductor gate structures on the transistor gate dielectric layer to selectively allow a potential to be provided across the second well region and the transparent conductive coating.

Additional aspects and/or advantages of the present invention will be set forth in part in the description which follows and, in part, will be obvious from the description, or may be learned by practice of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Definition of Terms

"CMOS photodiode (PD) pixel" refers to an image sensor generally provided in an array structure to form images, and including a photosensor and CMOS transistors to convert electromagnetic radiation to an electrical signal.

"Well region" refers to a doped region of a substrate or other layer grown on the substrate (e.g., epitaxial layer) in which ion implantation occurs to alter electrical characteristics thereof.

"Quantum efficiency" refers to the efficiency of an image sensor to intercept incoming photons and generate photo-electrons through a photoelectric effect. An ideal sensor would have 100% quantum efficiency (QE) at all wavelengths, that is every photon incident on the sensor would generate a photo-electron.

Figure 1:
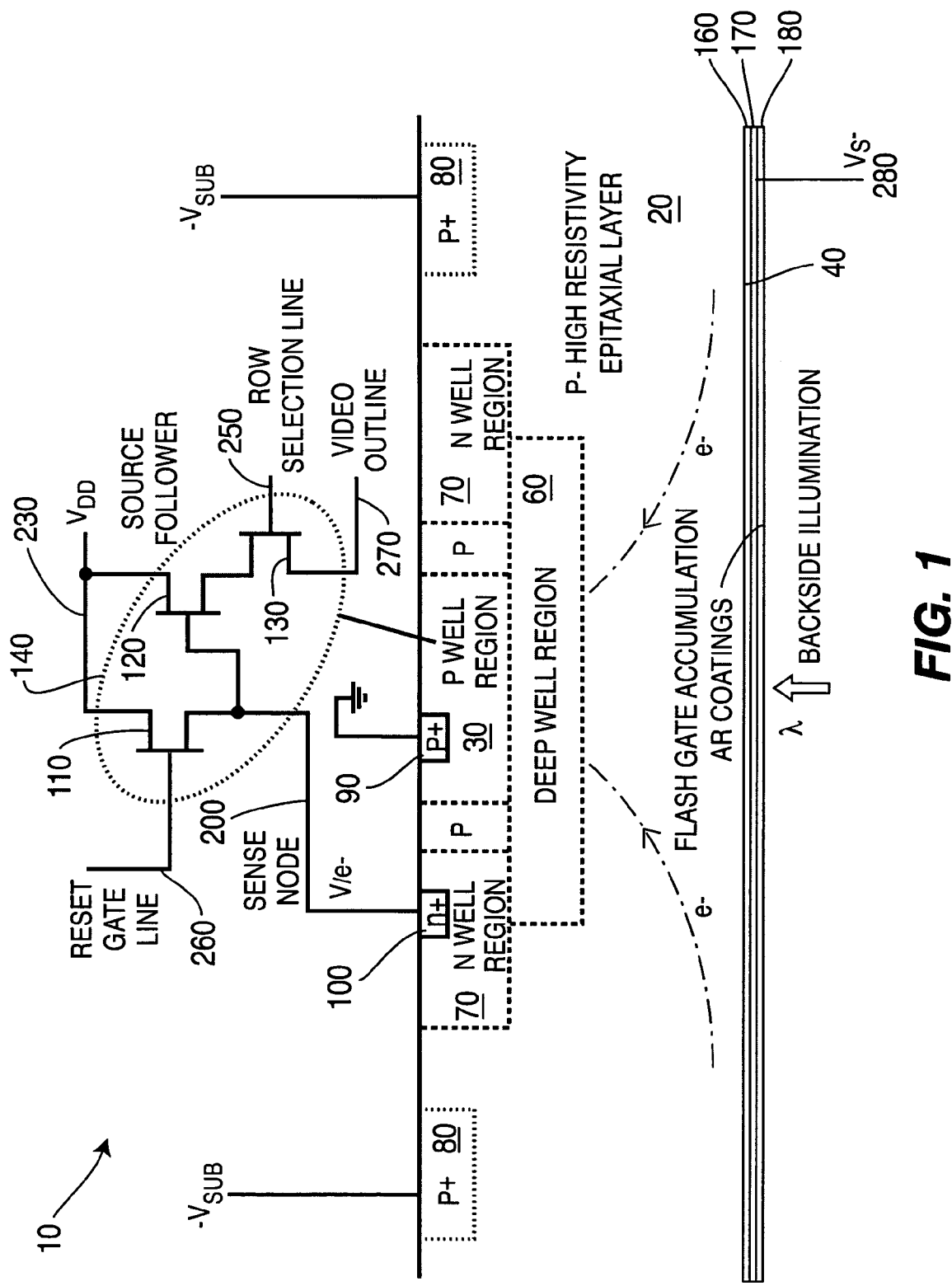
FIG. 1 is a schematic diagram of an image sensor in accordance with an embodiment of the present invention.

FIG. 1 is a schematic diagram of an image sensor in accordance with an embodiment of the present invention.

Referring to FIG. 1, in the image sensor, i.e., a CMOS PD pixel 10, a backside 40 of the of the epitaxial substrate layer 20, which is negatively biased relative to a p-well region 30 forces the photodiode (PD) depletion region toward the backside 40 of the CMOS PD pixel 10. A deep n-well process is used to provide a deep n-well region 60 to accommodate the biasing between the p-well region 30 and the backside 40 of the CMOS PD pixel 10. More particularly, the deep n-well region 60 is connected to a shallow n-well region 70, which is shaped in a form of a ring and is positioned circumferentially surrounding the p-well region 30. That is, the combination of the deep n-well region 60 and ring shaped n-well region 70 completely encircle and isolate the p-well region 30 from the substrate 20. Optionally, to ensure complete isolation of the p-well region 30 from the substrate 20, an optional ring-shaped intermediate depth n-well region 500 may be provided which may be disposed between and contiguous with or overlapping the deep n-well region 60 and the shallow ring shaped n-well region 70.

The deep n-well region 60 is an implanted sub-surface region in the substrate 20 in which dopant concentration levels above and below the deep n-well region 60 are substantially the same as that of the non-implanted substrate 20. The deep n-well region 60 may be formed as a retrograde n-well region by a high energy implant and thermal processing such that the dopant concentration level in the n-well region 60 peaks at a predetermined sub-surface depth in the substrate 20 and tails off from the peak concentration levels in the n-well region 60 at sub-surface depths farther from the predetermined sub-surface depth (i.e., dopant concentration levels of the n-well region reduce at depths farther from the predetermined sub-surface depth until the dopant concentration levels are substantially zero at appropriate sub-surface depths in the substrate 20.

The optional intermediate depth ring-shaped n-well region 500 may be an implanted sub-surface region in the substrate 20 in which dopant concentration levels above and below the optional intermediate depth ring-shaped n-well region 500 are substantially the same as that of the non-implanted substrate 20. The optional intermediate depth ring-shaped n-well region 500 may be formed as a retrograde n-well region by an intermediate energy implant and thermal processing such that the dopant concentration level in the n-well region 60 peaks at a predetermined sub-surface depth in the substrate 20 and tails off from the peak concentration levels in the optional intermediate depth ring-shaped n-well region 500 at sub-surface depths farther from the predetermined sub-surface depth (i.e., dopant concentration levels of the optional intermediate depth ring-shaped n-well region 500 reduce at depths farther from the predetermined sub-surface depth until the dopant concentration levels are substantially zero at appropriate sub-surface depths in the substrate 20. Since the optional intermediate depth ring-shaped n-well region 500 is configured to ensure isolation between the p-well region 30 and the substrate 20, the optional intermediate depth ring-shaped n-well region 500 may be contiguous with or may overlap with both the ring-shaped n-well region 70 and the deep n-well region 60.

Furthermore, a p+ isolation region 80, which is also shaped in a form of a ring, and is positioned circumferentially surrounding the ring-shaped n-well region 70 external to the ring shaped n-well region 70, may provide an antiblooming drain and, further, may provide biasing to substantially deplete at least a region between the deep n-well 60 and the transparent conductive layer 170. That is, the p+ isolation region 80 is coupled by a contact layer (not shown) to a drain line –VSUB to remove excess charge which is a charge buildup beyond a pixel charge saturation level and that, otherwise, would spill over into adjacent CMOS PD pixels, causing blurring and related image artifacts. The p+ isolation region may control surface dark current generated around the diode region.

Moreover, p+ and n+ ohmic contacts 90 and 100 are provided for the p-well region 30 and ring-shaped n-well region 70, respectively. The p+ ohmic contact 90 is connectable to any potential (e.g., a ground potential) so long as the CMOS PD pixel 10 is suitably, negatively biased. The p+ ohmic contact 90 is coupled to a sense node 200 of a conventional MOSFET readout circuit 140, that includes a reset MOSFET 110 which resets the photodiode before charge is integrated on the photo diode, a source follower MOSFET 120 which converts signal charge to an output voltage and a row selection MOSFET 130 which selects a line for scanned readout. The MOSFET readout circuit 140 is integrated onto the substrate 20 of the CMOS PD pixel 10.

On the backside 40 of the CMOS PD pixel 10 is an oxide layer 160 of high quality which covers the substrate 20. Covering the oxide layer 160 is a transparent conductive layer 170 (e.g., a metallic layer) which may be, for example, silver or indium-tin oxide (ITO). Furthermore, covering the transparent conductive layer 170 is a single layer or multilayer anti-reflective coating 180. The transparent conductive layer 170 may be coupled to a potential Vs– line 280 to negatively bias the transparent conductive layer 170 with respect to the p-well region 30 or a negative bias may be developed from biasing of the p+ isolation region 80.

Figure 2:
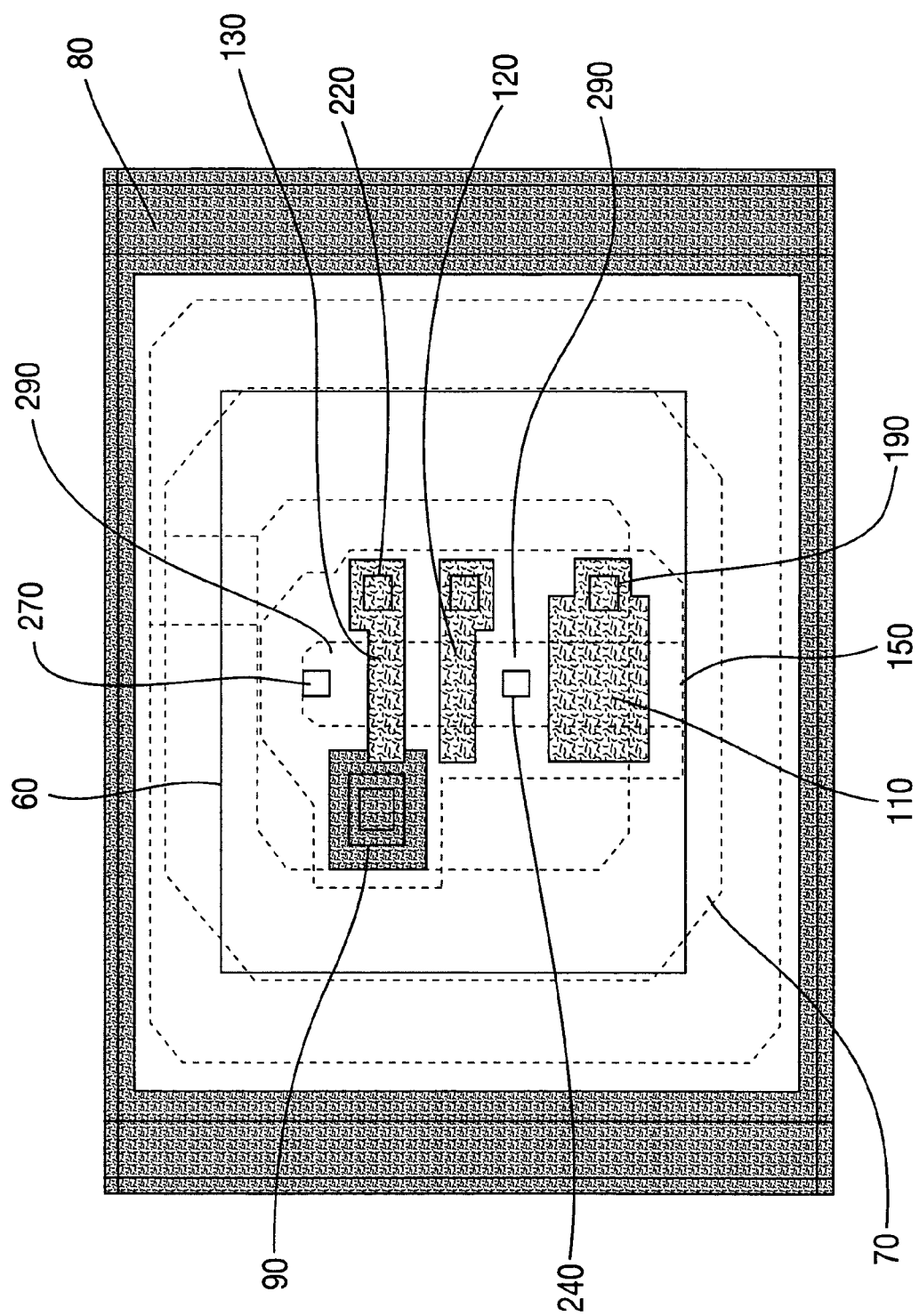
FIG. 2 is a partial top plan view of the physical layout of the image sensor of FIG. 1 with the metallization layer removed.

FIG. 2 is a partial top plan view of the layout of the CMOS PD pixel 10 illustrated in FIG. 1 with the metallization layer removed.

Referring to FIG. 2, each of the reset MOSFET 110, source follower MOSFET 120 and row selection MOSFET 130 share a common channel 150 having n-doped regions 290 used to form the reset MOSFET 110, source follower MOSFET 120 and row selection MOSFET 130. In the CMOS PD pixel 10, a row selection gate contact 220 is provided to couple a row selection gate of the row selection MOSFET 130 to the row selection line 250. A reset gate contact 190 is provided to couple the reset gate of the reset MOSFET 110 to the reset gate line 260. A video out contact 210 is provided to couple to the video out line 270. A VDD contact 240 is provided to couple to the VDD line 230. Further, a p+ ohmic contact 90 couples the p-well region 30 to a first potential level (e.g., ground potential). Moreover, a n+ ohmic contact 100 couples the ring-shaped n-well region 70 to the sense node 200.

When a negatively biased potential is applied or develops across the transparent conductive layer 170 and the p+ ohmic contact 90, a region between the p-well region 30 and the transparent conductive layer 170 can be made to have substantially full depletion in accordance with a magnitude of the applied or developed biased potential. When electromagnetic radiation of specific wavelengths illuminate the CMOS PD pixel 10, photo-electrons in the depletion region move to the ring-shaped n-well region 70 by the applied or developed bias potential. The charge buildup is sensed at the sense node 200 by the source follower MOSFET 120 and a video output signal corresponding in magnitude to the charge built up is output to the MOSFET readout circuit 140 from the video out line 270.

As is appreciated by one of skill in the art, the CMOS PD pixel 10 of FIG. 1 employs a p-type epitaxial substrate layer 20 including the deep n-well region 60 in combination with the ring-shaped n-well region 70 to provide increased isolation of a p-well region 30 from the substrate 20. It is further contemplated that the scope of the invention includes alternative embodiments such as a complementary CMOS PD pixel having an n-type epitaxial layer with a deep p-well region in combination with a ring-shaped p-well region. That is, a complementary CMOS PD pixel is contemplated with complementary conductive type structures to the one illustrated in FIGS. 1 and 2. The complementary CMOS PD pixel would have positive biasing across the n-well region and a transparent conductive layer arranged on a back side of the complementary CMOS PD pixel.

Furthermore, it can be appreciated that depth and dopant concentration level, for example, of the deep n-well region 60 of the CMOS PD pixel 10 may be varied to change the depletion depth characteristics of the CMOS PD pixel 10 to tailor the CMOS PD pixel 10, for example, to specific wavelengths of electromagnetic radiation.

Although, in this exemplary embodiment of the invention, one optional intermediate depth ring shaped n-well region 500 is illustrated, it can be appreciated that any number of overlaying n-well regions may be used to tailor dopant concentration levels within any of the n-well regions, for example, of the deep n-well region 60 or the ring-shaped n-well region 70 of the CMOS PD pixel 10 to change, for example, the depletion depth characteristics of the CMOS PD pixel 10.

Moreover, because the deep n-well region 60 is provided to isolate the p-well region 30 from the epitaxial layer 20, the epitaxial layer 20 may be formed to have a higher resistivity for the CMOS PD pixel 10 than that of the conventional art with the effect that a lower dopant concentration level may be used in the p-well region 30 than that of the conventional art.

Figure 3:
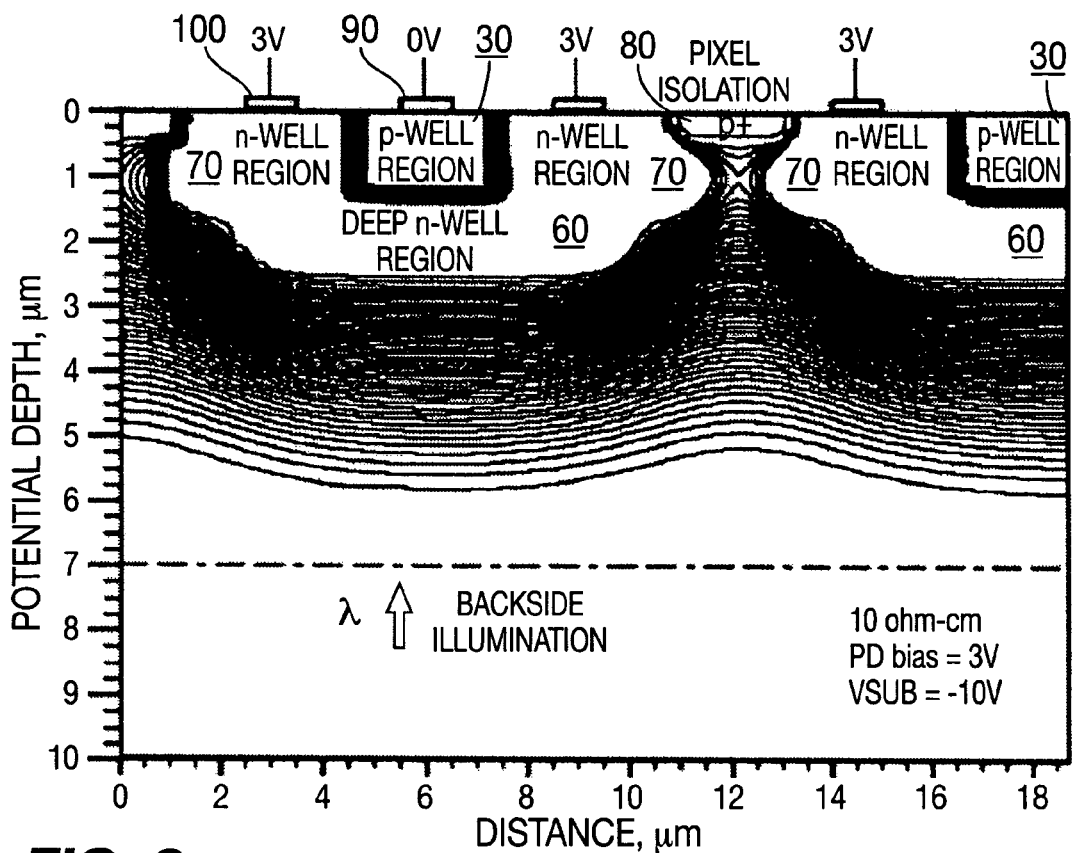
FIG. 3 is a graph which plots equal potential contours and a 6 μm depletion depth for the image sensor of FIG. 1 with 10 ohm-cm epitaxial silicon and bias potentials illustrated.

FIG. 3 is a graph which plots equal potential contours and a 6 μm depletion depth for the image sensor of FIG. 1 with 10 ohm-cm epitaxial silicon and bias potentials illustrated.

Referring to FIG. 3, the graph shows PISCES modeling results illustrating equal potential contours and the resultant depletion depth created by the CMOS PD pixel 10 shown in FIG. 1. A depletion depth of 6 μm is realized assuming 10 ohm-cm epitaxial silicon, PD bias of VPD=3 V and substrate bias of VSUB=−10 V. Thinning of the base 300 (i.e., thinning of the semiconductor chip) to approximately 7 to 8 μm is desired to achieve substantially full depletion. It is noted, that it is important that the depletion edge does not completely extend to the back surface 40 or, otherwise, a high dark current is generated. Proper depletion depth is set by varying substrate bias. Substantially full depletion is a maximum depletion without producing high dark currents caused by the depletion edge completely extending to the back surface 40 of the CMOS PD pixel 10. Higher resistivity and thicker silicon extends the depletion depth to meet application requirements.

Thus, the deep n-well region 60 compensates for the high resistivity epitaxial substrate layer 20 and allows for an improved QE and reduces the dopant concentration level in the p-well region 30. If the high resistivity epitaxial layer 20 were used without isolating the p-well region 30 from the high resistivity epitaxial layer 20 by the deep n-well region 60, then a problem would occur that a large leakage current would flow between the p-well region 30 and biased the high resistivity epitaxial substrate layer 20.

Figure 4:
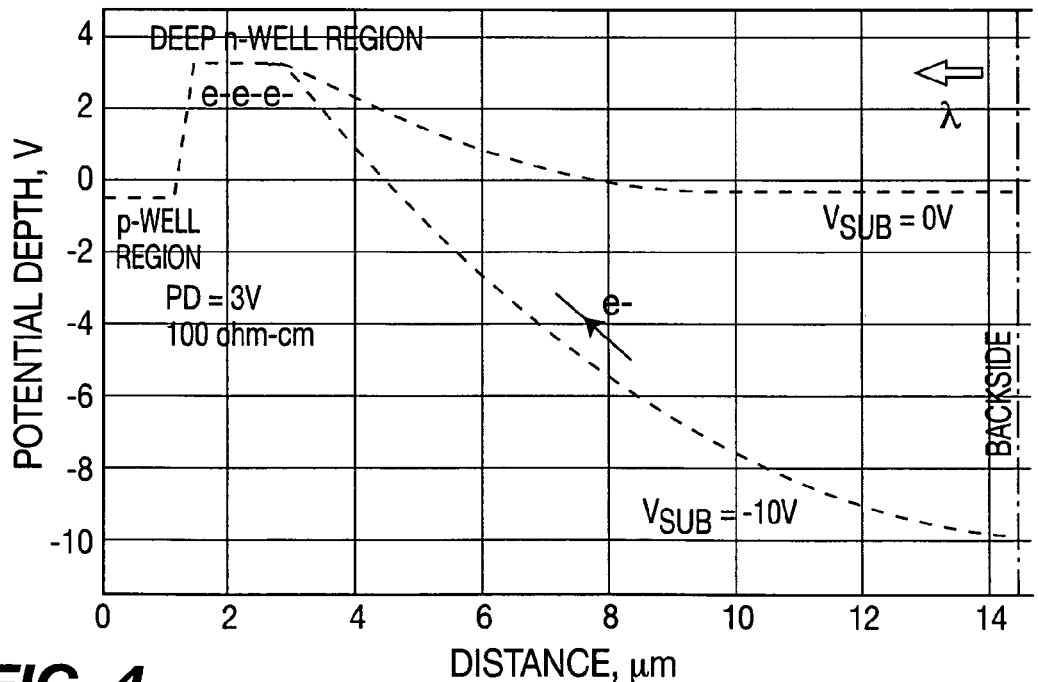
FIG. 4 is a graph which shows depletion depth in the image sensor of FIG. 1 at two different substrate bias conditions.

FIG. 4 is a graph which shows depletion depth in the image sensor of FIG. 1 at two different substrate bias conditions.

Referring to FIG. 4, a depletion depth of 15 μm is shown assuming 100 ohm-cm silicon and VSUB=−10 V. In this case, thinning of the base 300 to 15 μm provides substantially full depletion.

Figure 5:
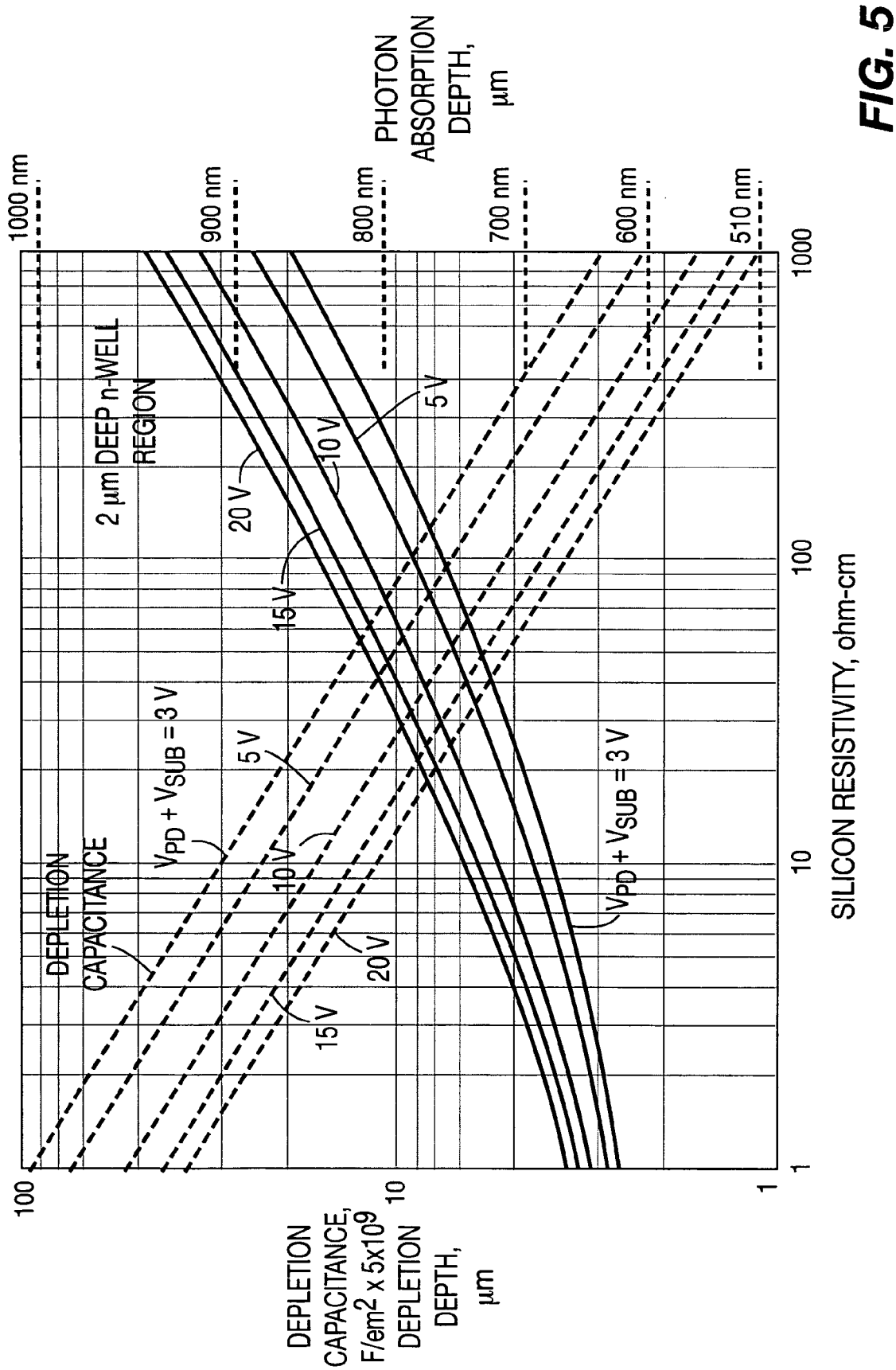
FIG. 5 is a graph which shows net depletion depth as a function of resistivity of silicon for different bias conditions assuming a diode junction depth of 2 μm. Also shown is a photo absorption depth for various wavelengths, and diode depletion capacitance.

FIG. 5 is a graph which shows net depletion depth as a function of silicon resistivity for different bias conditions assuming a diode junction depth of 2 μm. Also shown is the photon absorption depth for various wavelengths and the diode depletion capacitance.

Silicon resistivity greater than 500 ohm-cm is ideal for deep depletion and high near IR QE performance. As shown in FIG. 5, diode depletion capacitance decreases with the silicon resistivity and the applied or developed substrate bias. This characteristic is advantageous for the CMOS PD pixel 10 because depletion capacitance may be tailored to meet sensitivity (V/e−) and reset noise requirements. Further, modulation-transfer-function (MTF) and reset noise both decrease with the substrate bias.

Charge collection, determines the ability of an image sensor to reproduce image data. Charge collection efficiency (CCE) is an important parameter because it defines spatial resolution of an array of image sensors. Ideally, photo-electrons generated in the silicon should remain in the target pixel. Thermal diffusion and weak electric fields within an active volume of the target pixel may cause photo-electrons to wander into neighboring pixels, creating cross talk and related MTF loss, and poor color performance. Therefore, it is desirable that the charge collecting electric fields within the photo region of the pixel be sufficiently deep to match the photon absorption depth. Pixel cross talk is most conspicuous for near-IR and soft x-ray photons that penetrate deep into the image sensor, where weak electric fields exist. Also, pixel cross talk increases dramatically as pixel size is reduced.

Conventional CMOS image arrays show relatively poor charge CCE performance because standard foundry processes use low-resistivity silicon wafers (typically in a range less than <10 ohm-cm) and a low voltage drive (e.g., less than 3.3 V). A low-resistivity material is advantageous in CMOS image arrays to prevent cosmic-ray/radiation-event-triggered CMOS circuit latch-up and ground-bounce problems in CMOS electronic circuitry that is integrated with the CMOS image sensors. However, low-voltage operation, which is inherent to CMOS, reduces the electric field depth.

The problem of the reduced field depth in conventional CMOS image arrays is becoming severe because operating voltages decrease proportionally to feature sizes. For example, 0.18-μm CMOS processes operate at 1.8 V. Operating voltages will continue to decrease as CMOS technology advances. To compound the problem, a depletion region related to a photo region decreases as signal charges collect.

The CMOS PD pixel 10, employs an epitaxial substrate layer 20 that may have a higher resistivity without producing the above-mentioned problems of the conventional CMOS pixels. That is, the above-mentioned problems are avoided due to the implantation of the deep n-well region 60 in combination with the ring-shaped n-well region 70 and, optionally, an optional intermediate ring-shaped n-well region 500, which provide increased isolation of the p-well region 30 from the resistivity of the epitaxial substrate layer 20. The resistivity of the epitaxial substrate layer 20 in the CMOS PD pixel 10 may be set to be greater than 1 ohm-cm, but it is advantageous for the resistivity of the epitaxial substrate layer 20 in the CMOS PD pixel 10 to be greater than 10 ohm-cm to reduce the dopant concentration level in the p-well region 30.

Figure 6:
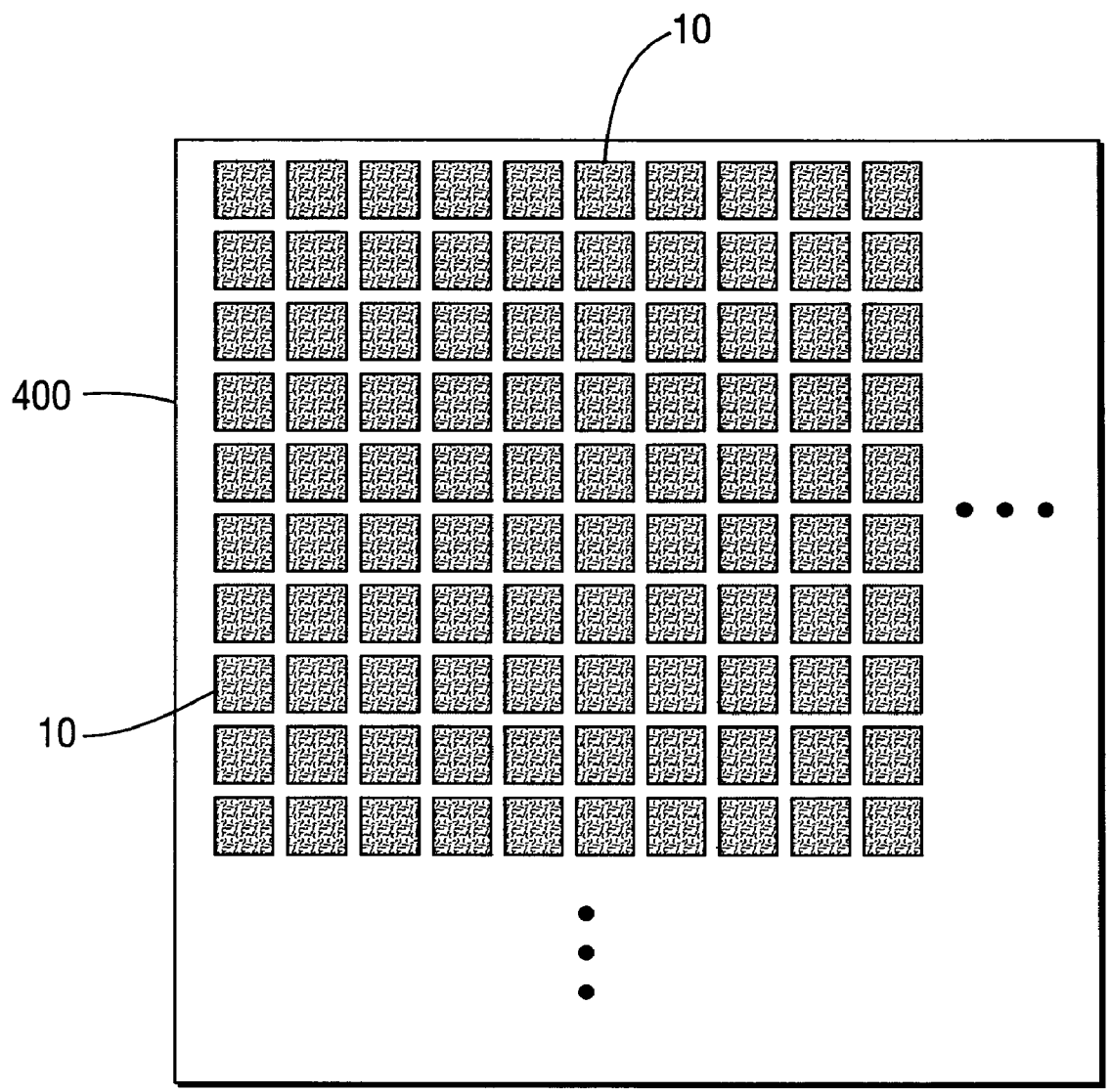
FIG. 6 is a schematic view of an array of image sensors of FIG. 1.

FIG. 6 is a schematic view of an array of image sensors of FIG. 1.

Referring the FIG. 6, a plurality of CMOS PD pixel 10 may be integrated into an array 400 of CMOS PD pixels 10 of varying sizes to produce images having various resolutions. Each of the CMOS PD pixels 10 of the array 400 is individually controllable using control circuitry (not shown) which is known in the art. Further, although square CMOS PD pixels 10 are shown, it is contemplated that other shapes are also applicable including n-sided polygonal shapes. It is preferable that the shape of the CMOS PD pixel be such that the CMOS PD pixels 10 are uniform in shape and size and have a high fill factor (i.e., have a minimum amount of dead space between neighboring CMOS PD pixels). Moreover, it is preferable that a common transparent conductive coating is arranged on the backside of the CMOS PD pixels 10 such that it is common to all of the CMOS PD pixels 10 of the array 400.

FIGS. 7–13 are cross-sectional views of the image sensor of FIG. 1 during its fabrication process, and includes photoresist layers used only in the fabrication of the image sensor.

For illustrative purposes, a method of fabricating the CMOS PD pixel 10 with a deep n-well region is illustrated. However, it is contemplated that a substantially similar method exists for a complementary CMOS PD pixel having a deep p-well region.

Figure 7:
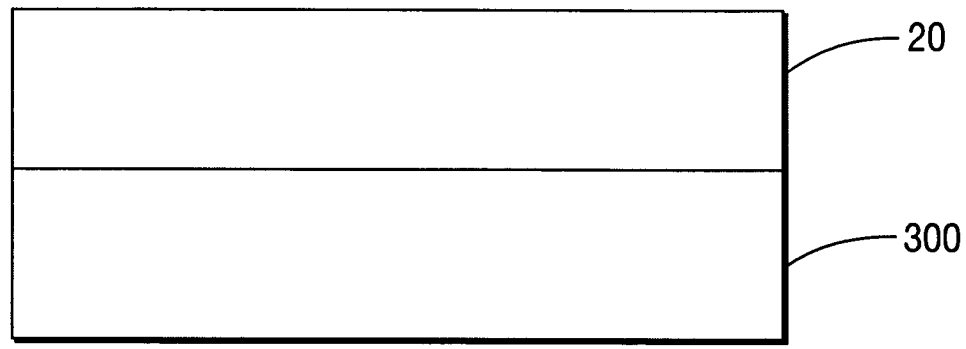
FIGS. 7, 8, 9, 10, 11, 12, and 13 are cross-sectional views of the image sensor of FIG. 1 during a fabrication process, and include photoresist layers used only in the fabrication of the image sensor.

FIG. 7 illustrates a semiconductor base 300, for example, a silicon substrate, a gallium-arsenide substrate or a silicon-germanium substrate, among others. An epitaxial layer 20 is formed on the semi-conductor base 300. The epitaxial layer 20, for illustration, is shown as p-type silicon. The epitaxial layer 20 may be formed by any known process, for example, chemical vapor deposition or liquid phase epitaxy, among others.

Figure 8:
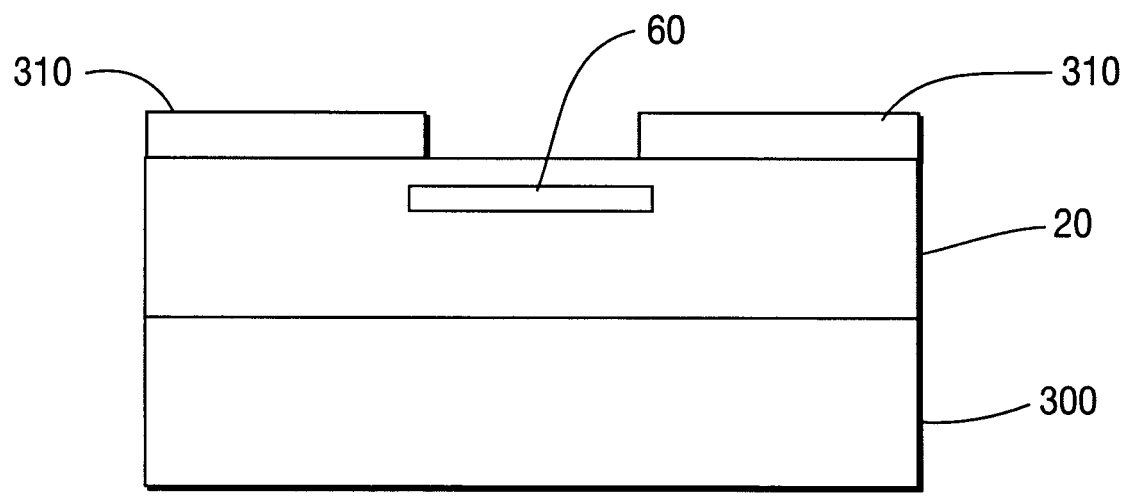

FIG. 8 illustrates a formation of the deep n-well region 60 in the p-type epitaxial layer 20. A photoresist layer 310 is formed on the p-type epitaxial layer 20. A mask (not shown) having openings therethrough is located over the photoresist layer 310 and an electromagnetic radiation (EMR) source is located over the mask so that the EMR penetrates through the openings onto selected areas of the photoresist layer 310. These selected areas change chemical composition so that they are subsequently, selectively etched. The photoresist layer 310 is then used as a mask for a high energy n-type implant process. The deep n-well region 60 is formed by a high energy n-type implant of n-type dopant ions in the high energy n-type implant process. After the deep n-well region 60 is implanted with the n-type dopant ions, the epitaxial layer 20 may be thermally processed producing diffusion of the n-type dopant ions. The photoresist layer 310 is then stripped to remove the photoresist layer 310 used in the high energy n-type implant process from the epitaxial layer 20. After all thermal processing of the CMOS PD pixel 10 is complete, a peak dopant concentration level of the deep n-well region 60 is desirably in a range of about $1\times10^{16}$ to $5\times10^{17}/cm^3$ and is desirably about 2–3 microns below a top surface of the epitaxial layer 20.

Figure 9:
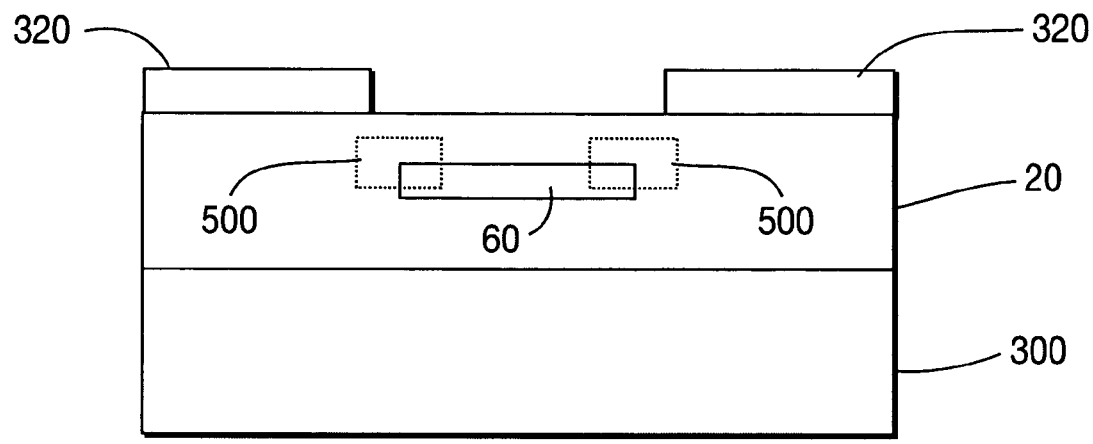

FIG. 9 illustrates an optional operation of formation of the optional intermediate depth ring-shaped n-well region 500 in the epitaxial layer 20 after the above processing operations illustrated in FIG. 8 are completed. A second photoresist layer 320 may be formed on the epitaxial layer 20. A second mask (not shown) having openings therethrough may be located over the second photoresist layer 320 and the EMR source may be located over the mask so that the EMR penetrates through the openings onto selected areas of the second photoresist layer 320. These selected areas may change chemical composition so that they may be subsequently, selectively etched. The second photoresist layer 320 may be then used as a mask for an intermediate energy n-type implant process (i.e. the intermediate energy level being in a range of about 700–1000 keV, and, preferably, 850 keV with a peak dopant concentration level, after all thermal processing in a range of about $1\times10^{16}$ to $5\times10^{17}/cm^3$), the intermediate energy implant process having a lower implant energy than that of the high energy implant process. The optional intermediate depth ring-shaped n-well region 70 may be formed by a intermediate energy n-type implant of n-type dopant ions in the intermediate energy n-type implant process. Thus, the intermediate energy n-type implant of n-type dopant ions may be at a lower energy than that of the high energy n-type implant of n-type dopant ions. If the optional intermediate depth ring shaped n-well region 500 is implanted with the n-type dopant ions, the epitaxial layer 20 may be thermally processed producing diffusion of the n-type dopant ions. Since, the formation of the intermediate depth ring-shaped n-well region is optional, it is illustrated by dashed lines for simplicity.

Figure 10:
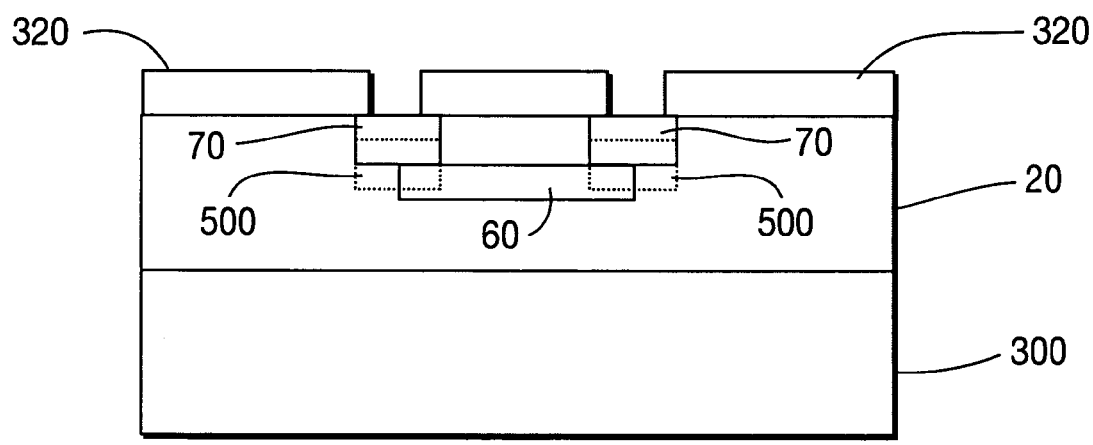

FIG. 10 illustrates a formation of the ring-shaped n-well region 70 in the epitaxial layer 20 either after processing operations illustrated in FIG. 8 or the optional processing operations in FIG. 9 are completed. The formation of the ring-shaped n-well region may use the existing second photoresist layer 320 which is formed on the epitaxial layer 20, if the optional operations illustrated in FIG. 9 are completed. Otherwise, the second photoresist layer 320 is formed on the epitaxial layer 20. The second mask (not shown) having openings therethrough is located over the second photoresist layer 320 and the EMR source is located over the mask so that the EMR penetrates through the openings onto the selected areas of the second photoresist layer 320. These selected areas change chemical composition so that they are subsequently, selectively etched. The second photoresist layer 320 is then used as a mask for a low energy n-type implant process, the low energy implant process having a lower implant energy than that of the high energy implant process and optionally having a lower implant energy than that of the intermediate energy implant process. The ring-shaped n-well region 70 is formed by a low energy n-type implant of n-type dopant ions in the low energy n-type implant process. Thus, the low energy n-type implant of n-type dopant ions is at a lower energy than that of the high energy n-type implant of n-type dopant ions and, optionally, at a lower energy than that of the intermediate energy n-type implant of n-type dopant ions. After the ring shaped n-well region 70 is implanted with the n-type dopant ions, the epitaxial layer 20 may be thermally processed producing diffusion of the n-type dopant ions. The second photoresist layer 320 is then stripped to remove the second photoresist layer 320 used in the low energy n-type implant process from the epitaxial layer 20.

Figure 11:
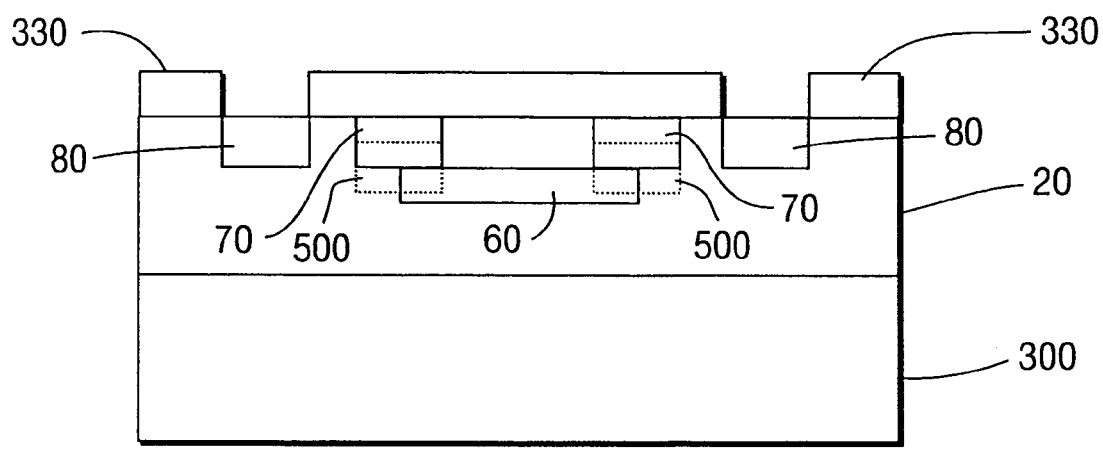

FIG. 11 illustrates a formation of the p+ isolation region 80 in the epitaxial layer 20 after the above processing operations illustrated in FIG. 9 are completed. The p+ isolation region 80 is formed circumferentially surrounding the ring-shaped n-well region. A third photoresist layer 330 is formed on the epitaxial layer 20. A third mask (not shown) having openings therethrough is located over the third photoresist layer 330 and the EMR source is located over the third mask so that the EMR penetrates through the openings onto selected areas of the third photoresist layer 330. These selected areas change chemical composition so that they are subsequently, selectively etched. The third photoresist layer 330 is then used as a mask for a first energy p-type implant process, the first energy p-type implant process may have substantially the same energy level as that of the low energy n-type implant used to form the ring-shaped n-well region 70. The p+ isolation region 80 is formed by a first energy p-type implant of p-type dopant ions in the first energy p-type implant process. Thus, the first energy p-type implant of p-type dopant ions may be at a lower energy than that of the high energy n-type implant of n-type dopant ions. After the p+ isolation region 80 is implanted with the p-type dopant ions, the epitaxial layer 20 may be thermally processed producing diffusion of the p-type dopant ions. The third photoresist layer 330 is then stripped to remove the third photoresist layer 330 used in the low energy p-type implant process from the epitaxial layer 20.

Figure 12:
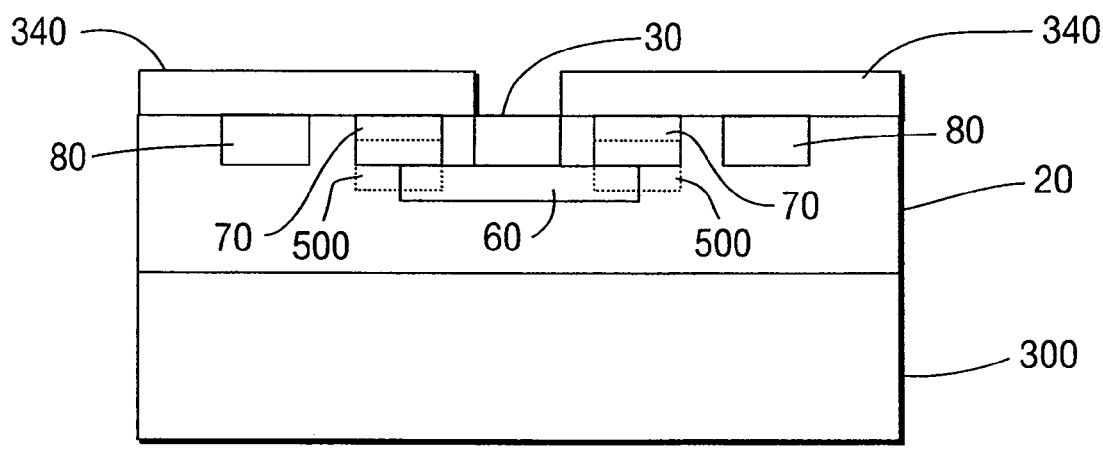
Figure 13:
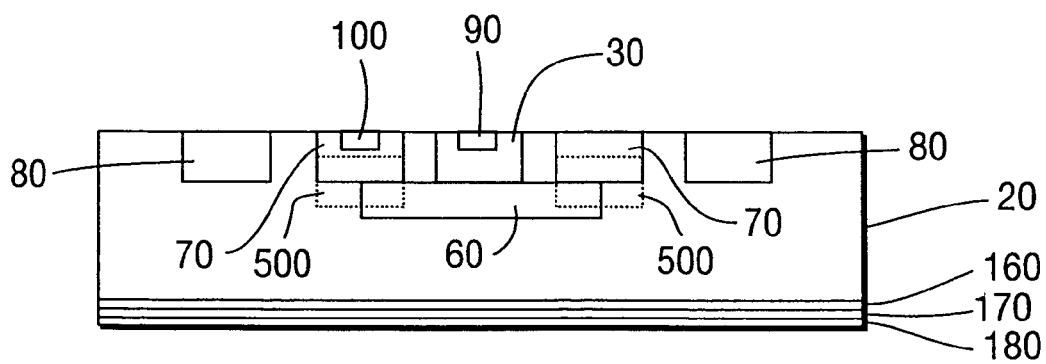

FIG. 12 illustrates a formation of the p-well region 30 in the epitaxial layer 20 after the above processing operations illustrated in FIG. 6 are completed. A fourth photoresist layer 340 is formed on the epitaxial layer 20. A fourth mask (not shown) having openings therethrough is located over the fourth photoresist layer 340 and the EMR source is located over the fourth mask so that the EMR penetrates through the openings onto selected areas of the fourth photoresist layer 340. These selected areas change chemical composition so that they are subsequently, selectively etched. The fourth photoresist layer 340 is then used as a mask for a second energy p-type implant process, the second energy p-type implant process may have substantially the same energy level as the low energy n-type implant used to form the ring-shaped n-well region 70. The p-well region 30 is formed by a second energy p-type implant of p-type dopant ions in the second energy p-type implant process. Thus, the second energy p-type implant of p-type dopant ions is at a lower energy than that of the high energy n-type implant of n-type dopant ions. After the p-well region 30 is implanted with the p-type dopant ions, the epitaxial layer 20 may be thermally processed producing diffusion of the p-type dopant ions. The fourth photoresist layer 340 is then stripped to remove the fourth photoresist layer 340 used in the second energy p-type implant process from the epitaxial layer 20.

It is contemplated that the fabrication process for the CMOS PD pixel 10 may be accomplished by the operation illustrated in any number of different orders with an exception that it is preferable that the high energy implantation of the deep n-well region 60 be accomplished prior to the energy implantations of the optional intermediate depth ring shaped n-well region 500, if this energy implantation is to be completed, the ring shaped n-well region 70 and the p-well region 30.

Moreover, it is contemplated that the epitaxial layer 20 may be formed of high resistivity material (i.e., a resistivity of greater than 10 ohm-cm) such that the dopant concentration level of the p-well implant ions is low. That is, the peak dopant concentration level of the p-well region 30 should be in a range of about $1 \times 10^{16}$ to $5 \times 10^{17}/cm^3$.

FIG. 12 illustrates a fabricated CMOS PD pixel 10. To facilitate completion of the CMOS PD pixel 10, the CMOS PD pixel 10 may be annealed by any known art process. Thereafter, a transistor gate dielectric layer (no shown) is formed, followed by gate definition in a conventional manner. N+ and p+ diffusion regions (not shown) are separately defined followed by ion implantation of the n-type and p-type dopant, respectively. Further, conventional CMOS multi-layer metal, contacts and structures are formed for interconnection external to the CMOS PD pixel 10.

When the frontside processing of the PD pixel 10 CMOS is complete, backside processing of the CMOS PD pixel 10 is implemented. Because the conventional CMOS metal layers are formed on the front side of the CMOS PD pixel 10, a low temperature of less than 400° C. is desirably used in the backside processing, preferably, using a flash gate accumulation process as described in U.S. Pat. No. 5,005,063 to J. Janesick entitled CCD IMAGING SENSOR WITH FLASHED BACKSIDE METAL FILM. That is, the backside process uses either a temporary or permanent support of the front side of the CMOS PD pixel 10 while the backside 40 is mechanically/chemically removed to a thickness in a range of approximately 10 to 40 microns. On the backside 40 of the CMOS PD pixel 10 which remains after the mechanical/chemical removal, a high quality oxide layer 160 is grown and a thin transparent conductive layer 170 is formed on the high quality oxide layer 160. On the thin transparent conductive layer 170, which is typically silver, a single layer or multi-layer thin film anti-reflection coating 180 is formed.

After all thermal processing of the CMOS PD pixel 10 is complete, a peak dopant concentration level of the deep n-well region 60 is desirably in a range of about $1 \times 10^{16}$ to $5 \times 10^{17}/cm^3$ and is desirably about 2–3 microns below a top surface of the epitaxial layer 20, a peak dopant concentration level of the ring-shaped n-well region 70 is desirably in a range of about $1 \times 10^{16}$ to $5 \times 10^{17}/cm^3$ and is desirably about 0.5–1.0 microns below a top surface of the epitaxial layer 20 and a peak dopant concentration level of the p-well region 30 is desirably in a range of about $1 \times 10^{16}$ to $5 \times 10^{17}/cm^3$ and is desirably about 0.5–1.0 microns below the top surface of the epitaxial layer 20 and located circumferentially inside the ring-shaped n-well region 70 and between the top surface of the epitaxial layer 20 and the deep n-well region 60.

Further, the deep n-well region 60 and the ring-shaped n-well region 70 are contiguous. That is, the deep n-well region 60 and the ring-shaped n-well region 70 may border (i.e. be connected to) each other or overlay each other to provide improved isolation of the p-well region 30 from the epitaxial layer 20.

It should be mentioned that the CMOS PD pixel 10 shown in FIG. 1 is vulnerable to image lag if not properly reset, as is the case for all CMOS PD pixels. Image lag occurs when the reset gate of the reset MOSFET 110 is only clocked high to the pixel supply voltage VDD (this is referred to as "soft reset"). During a reset time, a potential under the reset gate of the reset MOSFET 110 is less than the gate voltage of the reset MOSFET 110 by a threshold and body effect voltage Vth. That is the potential under the reset gate is VDD−Vth. In this state, free charges from the sense node 200 may thermally jump over the reset gate barrier to the VDD drain region. As charge escapes, the sense node voltage increases which results in a signal variation that is measured as image lag at an output of the source follower MOSFET 120. Image lag may be substantially reduced by driving the gate of the reset MOSFET 110 with a clock voltage greater than VDD+Vth (this is referred to as a "hard reset"). The clocking action forces both the sense node 200 and potential under the reset gate of the reset MOSFET 110 to a voltage of VDD, thereby eliminating the field that causes electrons to leave the sense node 200. This mode of operation is also advantageous because it increases a well capacity of the CMOS PD pixel 10 by allowing the sense node voltage to swing over a greater range (typically, the range increases by a factor of two) and increases the depletion depth of the CMOS PD pixel 10. Accordingly, the CMOS PD pixel 10 may preferably used hard reset operations.

The CMOS PD pixel 10, preferably, may use "rolling shutter" readout, which produces a reset noise level of 20–70 e—depending on a size of the CMOS PD pixel 10. To further reduce noise in the image signal, a correlated double sampling (CDS) circuit may be used.

A CMOS PD pixel is provided for backside illumination having substantially full depletion. A negatively biased substrate forces a PD depletion region to a backside of the CMOS PD pixel 10. To accommodate this biasing feature, the pixel uses a deep n-well process. A deep n-well region 60 is connected to a shallow n-well region which together act as the PD. The combined deep n-well region 60 and shallow n-well region 70 and the optional intermediate depth n-well region 500 completely encircles the p-well region 30 to isolate the p-well region 30 from the epitaxial layer 20. Without this isolation a large leakage current would flow between the p-well region 30 and negatively biased substrate. The p-well region 30, which is held at a higher bias level that the negatively biased epitaxial layer 20 (e.g., at ground potential), is used by the readout MOSFET circuit 140. A front side p+ ohmic contact 90 and the p+ isolation region 80 allow for a suitable substrate bias.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A CMOS image sensor having a substrate with front and back sides to produce image data, comprising:
    a transparent conductive coating arranged on the back side of the substrate;
    a first well region of a first conductive type;
    a second well region of a second conductive type, different from the first conductive type, and circumferentially surrounding the first well region of the first conductive type; and
    a third well region of the second conductive type disposed between both of the first well region of the first conductive type and the second well region of the second conductive type and the transparent conductive coating arranged on the back side of the substrate.

2. The CMOS image sensor according to claim 1, wherein peak doping concentrations in the second and third well regions of the second conductive type are substantially equal.

3. The CMOS image sensor according to claim 1, wherein the third well region is a retrograde well region.

4. A CMOS Image sensor having a substrate with front and back sides, to produce image data, comprising:
    a transparent conductive coating arranged on the back side of the substrate;
    a first well region of a first conductive type arranged adjacent with the front side of the CMOS image sensor; and
    a second well region of a second conductive type, different from the first conductive type and including at least a deep well region, the first well region being isolated from the substrate by the second well region.

5. The CMOS image sensor according to claim 4, wherein the CMOS image sensor is a back illuminated Image sensor.

6. The CMOS image sensor according to claim 4, wherein the second well region comprises:
    an upper well region disposed circumferentially surrounding the first well region, the deep well region being disposed between the first well region and the substrate.

7. The CMOS image sensor according to claim 4, further comprising:
    an isolation region disposed circumferentially surrounding the second well region, and configured to prevent excess charge from moving to neighboring CMOS image sensors and to at least substantially deplete a depletion region between the transparent conductive coating and the deep well region.

8. The CMOS image sensor according to claim 4, wherein the substrate has a resistivity of 500 ohm-cm or greater.

9. The CMOS image sensor according to claim 4, wherein the first and second well regions of the CMOS image sensor fit within a profile of an n-sided polygonal.

10. The CMOS image sensor according to claim 6, wherein the deep well region has a peak dopant concentration level in a range of about $1\times10^{16}$ to $5\times10^{17}/cm^3$ and is disposed about 2 to 3 microns below a top surface of the substrate, the upper well region has a peak dopant concentration level in the range of about $1\times10^{16}$ to $5\times10^{17}/cm^3$ and is disposed about 0.5 to 1.0 microns below the top surface of the substrate and the first well region has a peak dopant concentration level of in the range of about $1\times10^{16}$ to $5\times10^{17}/cm^3$ and is disposed about 0.5 to 1.0 microns below the top surface of the substrate and located circumferentially inside the upper well region and between the top surface of the substrate and the deep well region.

11. The CMOS image sensor according to claim 4, wherein the second well region of the second conductive type further includes:
    an intermediate well region that circumferentially surrounds the first well region, and at least one portion of the intermediate well region is contiguous with or overlaps with at least one portion of the deep well region; and
    a shallow well region that circumferentially surrounds the first well region, that is arranged adjacent with the front side of the CMOS image sensor and having at least one portion of the shallow well region that is contiguous with or overlap with at least a portion of the intermediate well region.

12. An CMOS imager having a substrate with front and back sides, the substrate having a plurality of pixels arranged therein in an array to produce an image, comprising:
    a common transparent conductive coating arranged on the back side of the substrate and common to all of the pixels; wherein each of the pixels comprises:
    a first well region of a first conductive type;
    a second well region of a second conductive type, different from the first conductive type, and circumferentially surrounding the first well region of the first conductive type; and
    a third well region of the second conductive type disposed between both of the first well region of the first conductive type and the second well region of the second conductive type and the common transparent conductive coating arranged on the back side of the substrate.

13. The CMOS Imager according to claim 12, wherein peak doping concentrations in the second and third well regions of the second conductive type of respective ones of the pixels are substantially equal.

14. An CMOS imager having a substrate with front and back sides, the substrate having a plurality of pixels arranged therein in an array to produce an image, comprising:
    a common transparent conductive coating arranged on the back side of the substrate and common to all of the pixels; wherein each of the pixels comprises:
    a first well region of a first conductive type arranged adjacent with the front side of the CMOS imager; and
    a second well region of a second conductive type, different from the first conductive type and including at least a deep well region, the first well region being isolated from the common transparent conductive coating by the second well region.

15. The CMOS imager according to claim 14, wherein the CMOS imager is a back illuminated imager.

16. The CMOS imager according to claim 14, wherein the second well region of each of the pixels further includes:

an upper well region disposed circumferentially surrounding the first well region, the deep well region being disposed between the first well region and the substrate.

17. The CMOS imager according to claim 14, wherein each of the pixels further comprises:

an isolation region disposed circumferentially surrounding the second well region, and configured to prevent excess charge from moving to neighboring CMOS image pixels and to at least substantially deplete a depletion region between the common transparent conductive coating and the deep well region.

18. The CMOS imager according to claim 14, wherein the substrate of each of the pixels has a resistivity of 10 ohm-cm or greater.

19. The CMOS imager according to claim 14, wherein the first and second well regions of respective pixels fit within a profile of an n-sided polygonal.

20. The CMOS imager according to claim 16, wherein each of the pixels includes the deep well region having a peak dopant concentration level in a range of about $1\times10^{16}$ to $5\times10^{17}/cm^3$ and being disposed about 2 to 3 microns below a top surface of the substrate, the upper well region having a peak dopant concentration level in the range of about $1\times10^{16}$ to $5\times10^{17}/cm^3$ and being disposed about 0.5–1.0 microns below the top surface of the substrate and the first well region having a peak dopant concentration level of in the range of about $1\times10^{16}$ to $5\times10^{17}/cm^3$ and being disposed about 0.5 to 1.0 microns below the top surface of the substrate and located circumferentially inside the upper well region and between the top surface of the substrate and the deep well region.

* * * * *